(12) United States Patent
Holt et al.

(10) Patent No.: US 9,059,286 B2
(45) Date of Patent: Jun. 16, 2015

(54) PRE-GATE, SOURCE/DRAIN STRAIN LAYER FORMATION

(71) Applicant: International Business Machines Corporation, Armonk, NY (US)

(72) Inventors: Judson R. Holt, Hopewell Junction, NY (US); Viorel C. Ontalus, Hopewell Junction, NY (US); Keith H. Tabakman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 14/230,087

(22) Filed: Mar. 31, 2014

(65) Prior Publication Data
US 2014/0213029 A1     Jul. 31, 2014

Related U.S. Application Data

(63) Continuation of application No. 12/719,312, filed on Mar. 8, 2010, now abandoned.

(51) Int. Cl.
*H01L 29/78* (2006.01)
*H01L 21/8234* (2006.01)
*H01L 29/66* (2006.01)

(52) U.S. Cl.
CPC ........ *H01L 29/7848* (2013.01); *H01L 29/7849* (2013.01); *H01L 29/7842* (2013.01); *H01L 21/823412* (2013.01); *H01L 29/78* (2013.01); *H01L 29/66477* (2013.01)

(58) Field of Classification Search
CPC ............ H01L 29/7848; H01L 29/7849; H01L 29/7842; H01L 21/823412; H01L 21/823807
USPC ................. 438/269, 429, 222; 257/E21.618, 257/E21.619
See application file for complete search history.

(56) References Cited

U.S. PATENT DOCUMENTS

| | | | |
|---|---|---|---|
| 6,472,685 B2 | 10/2002 | Takagi | |
| 6,831,292 B2 * | 12/2004 | Currie et al. | ............ 257/19 |
| 6,844,227 B2 | 1/2005 | Kubo et al. | |
| 6,927,414 B2 | 8/2005 | Ouyang et al. | |
| 6,943,087 B1 | 9/2005 | Xiang et al. | |
| 6,995,054 B2 | 2/2006 | Oda et al. | |
| 7,208,361 B2 | 4/2007 | Shah et al. | |
| 7,358,551 B2 | 4/2008 | Chidambarrao et al. | |
| 7,494,884 B2 | 2/2009 | Lin et al. | |

(Continued)

OTHER PUBLICATIONS

U.S. Appl. No. 13/432,018, Advisory Action Communication, Apr. 7, 2014, 3 pages.

(Continued)

*Primary Examiner* — Stephen W Smoot
*Assistant Examiner* — Sun M Kim
(74) *Attorney, Agent, or Firm* — Gibb & Riley, LLC

(57) ABSTRACT

A method produces a transistor. The method forms a strain-producing layer on a base layer and then removes at least one portion of the strain-producing layer to create at least one opening in the strain-producing layer. This leaves first and second portions of the strain-producing layer on the substrate. The first and second portions of the strain-producing layer comprise source and drain stressor regions of the transistor. The method then grows a channel region in the opening of the strain-producing layer from the base layer, forms a gate insulator on the channel region, and forms a gate conductor on the gate insulator.

11 Claims, 5 Drawing Sheets

(56) References Cited

U.S. PATENT DOCUMENTS

| | | |
|---|---|---|
| 7,534,689 B2 | 5/2009 | Pal et al. |
| 7,592,214 B2 | 9/2009 | Ohta |
| 7,741,658 B2 | 6/2010 | Liu et al. |
| 2006/0073646 A1* | 4/2006 | Yang .............................. 438/152 |
| 2006/0226492 A1 | 10/2006 | Nguyen et al. |
| 2007/0096149 A1 | 5/2007 | Liu et al. |
| 2007/0190741 A1 | 8/2007 | Lindsay |
| 2008/0023752 A1 | 1/2008 | Chen et al. |
| 2008/0119019 A1 | 5/2008 | Han et al. |
| 2008/0217686 A1 | 9/2008 | Majumdar et al. |
| 2008/0246056 A1 | 10/2008 | Chan et al. |
| 2008/0305621 A1 | 12/2008 | Dyer et al. |
| 2009/0050942 A1 | 2/2009 | Liu et al. |
| 2009/0121235 A1 | 5/2009 | Kim et al. |
| 2009/0215249 A1 | 8/2009 | Boland et al. |
| 2010/0187578 A1 | 7/2010 | Faltermeier et al. |

OTHER PUBLICATIONS

U.S. Appl. No. 13/1432,018, Examiner's Answer Communication, Sep. 2, 2014, 10 pages.

Wakabayashi, H., "Strain Technology under Metal/High-k Damascene-Gate Stacks," Japan, 1 page.

Ota, et al., "Scalable eSiGe S/D technology with less layout dependence for 45-nm generation," Symposium on VLSI Technology Digest of Technical Papers, 2006, 2 pages.

Hecker, et al., "Strain state in silicon structures for microprocessor technology," Materials Science-Poland, vol. 25, No. 1, 2007, pp. 7-18.

Harper, R., "Epitaxial engineered solutions for ITRS scaling roadblocks," Materials Science and Engineering, B 134, 2006, pp. 154-158.

Michael Quirk et al., "Semiconductor Manufacturing Technology", IC Fabrication Process Overview, 2001, pp. 1-13.

U.S. Appl. No. 12/719,312, Office Action Communication, Jan. 6, 2012, 9 pages.

U.S. Appl. No. 12/719,312, Office Action Communication, Feb. 17, 2012, 16 pages.

U.S. Appl. No. 12/719,312, Office Action Communication, Feb. 11, 2013, 18 pages.

U.S. Appl. No. 12/719,312, Office Action Communication-Advisory Action, May 10, 2013, 3 pages.

U.S. Appl. No. 12/719,312, Office Action Communication-Panel Decision, Jun. 6, 2013, 1 page.

U.S. Appl. No. 12/719,312, Office Action Communication, Jul. 26, 2013, 18 pages.

U.S. Appl. No. 12/719,312, Office Action Communication, Jan. 31, 2014, 3 pages.

U.S. Appl. No. 13/432,018, Office Action Communication, Jul. 19, 2013, 16 pages.

U.S. Appl. No. 13/432,018, Office Action Communication, Jan. 31, 2014, 15 pages.

* cited by examiner

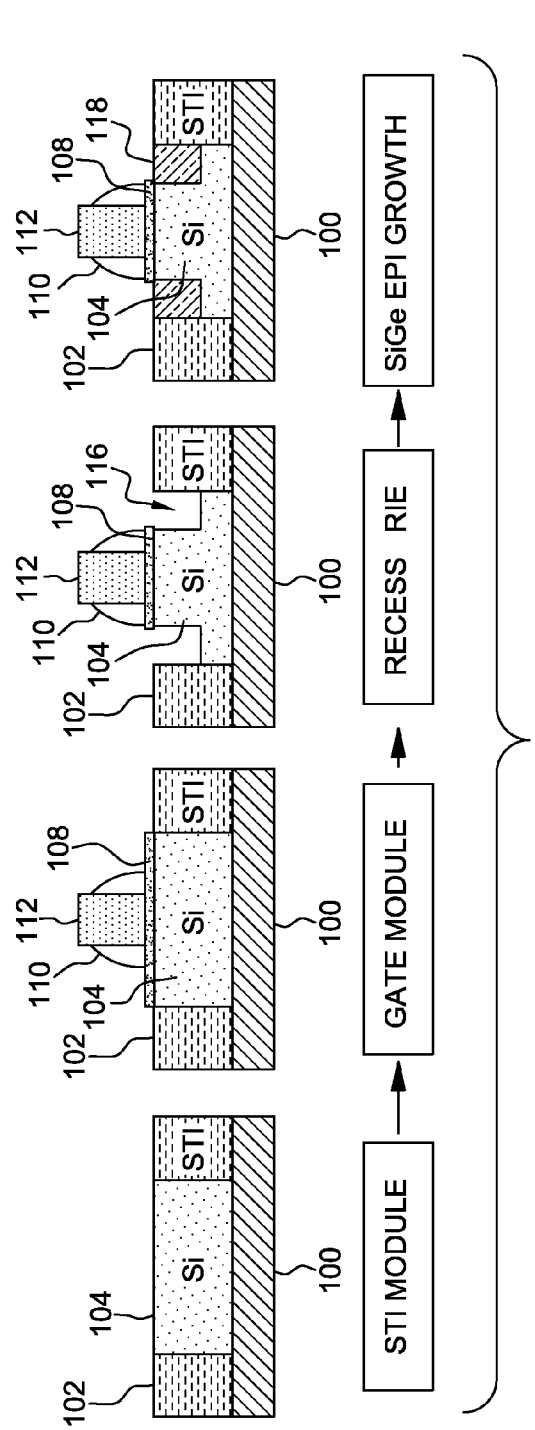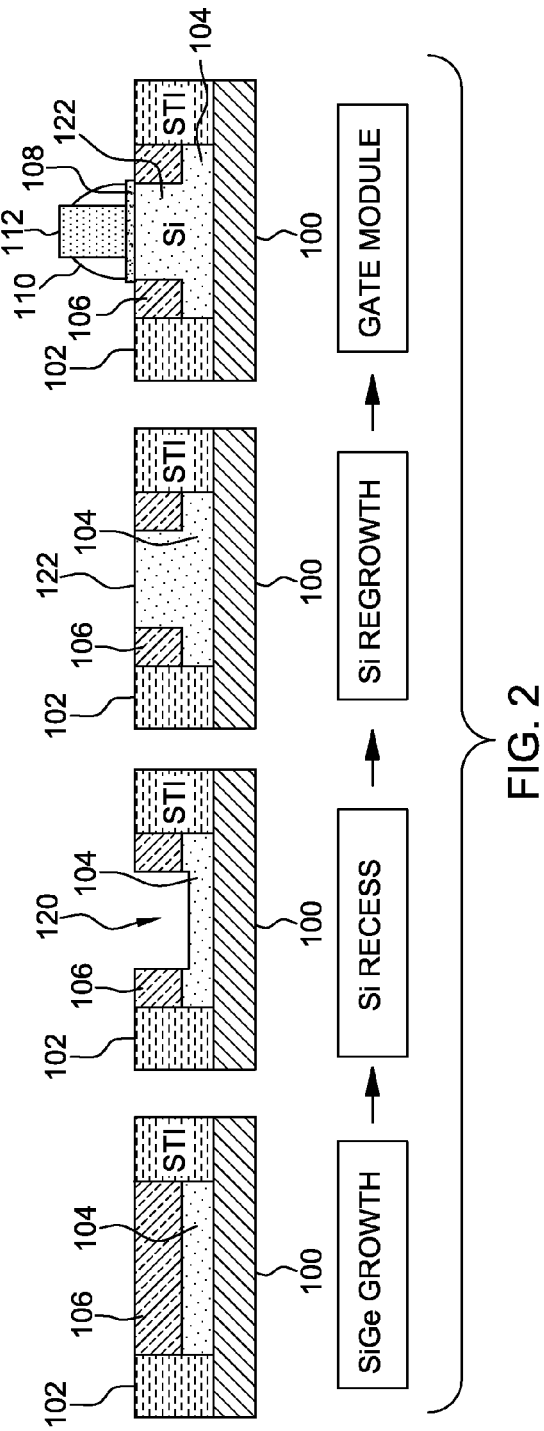

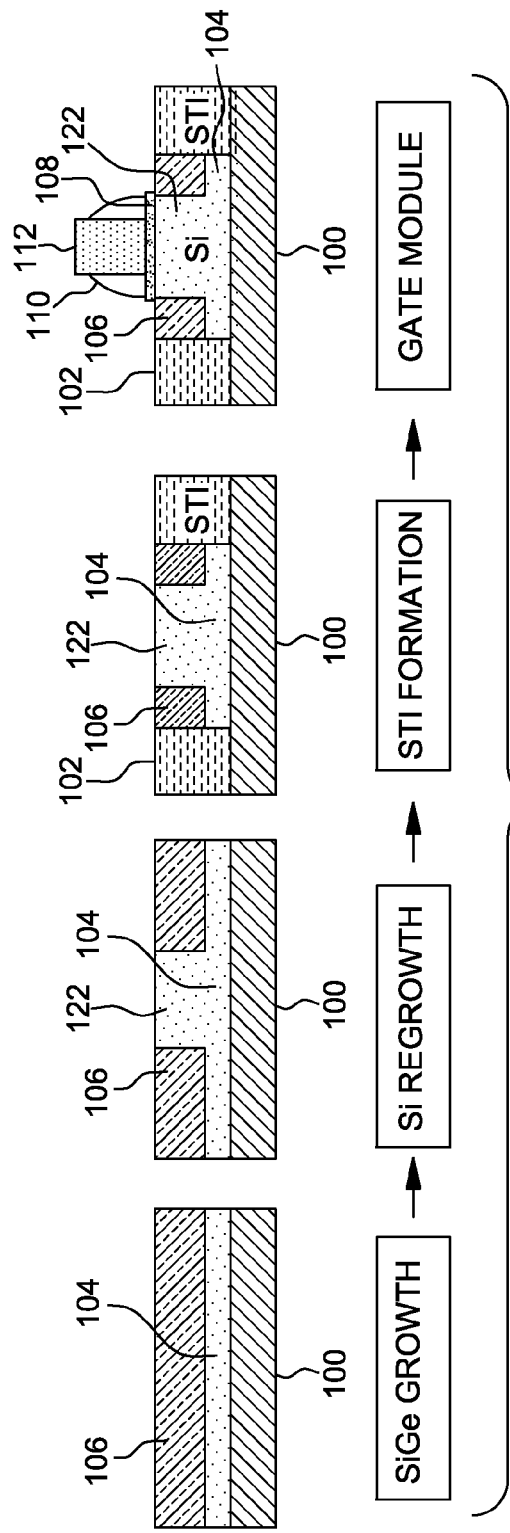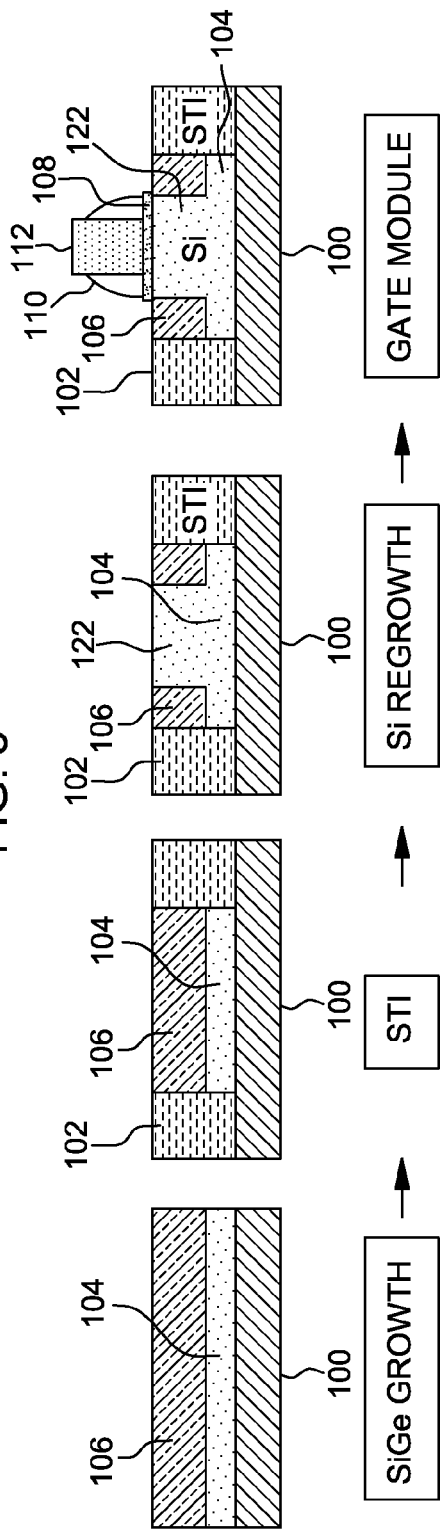

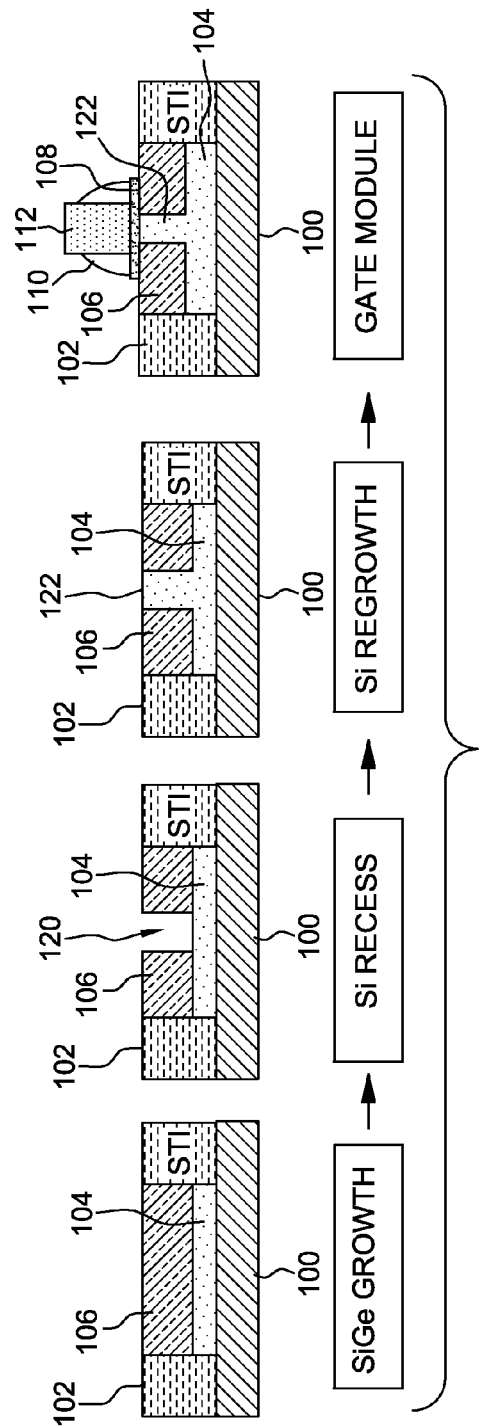
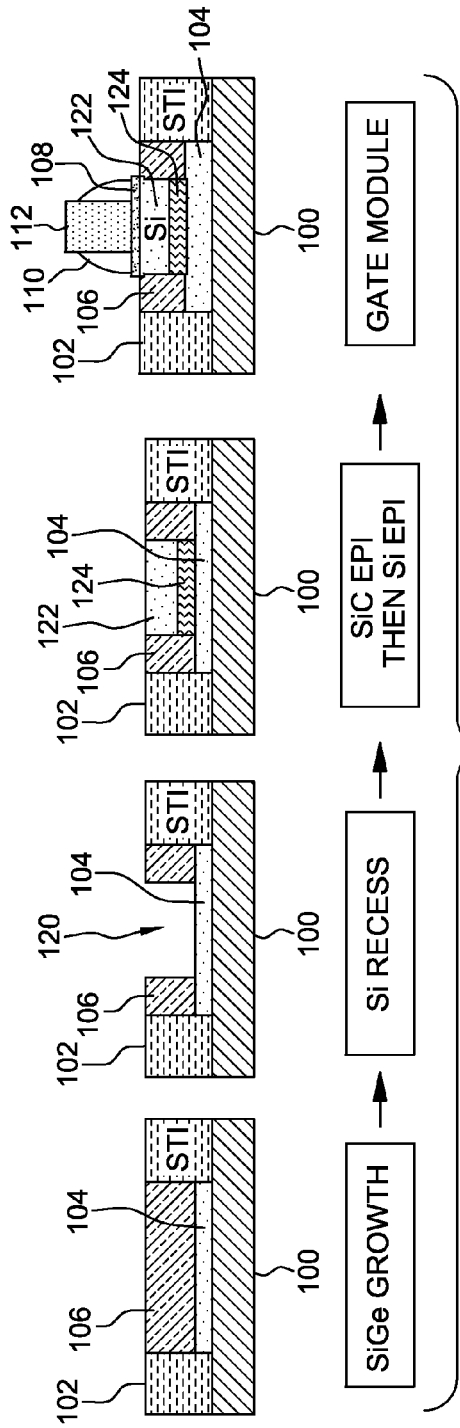

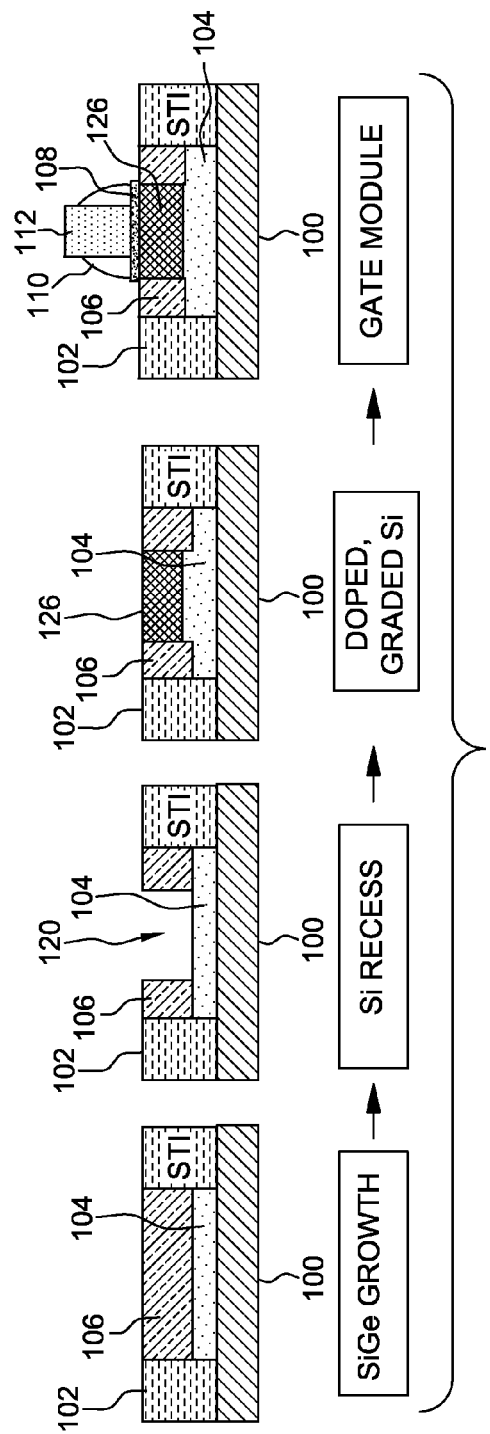
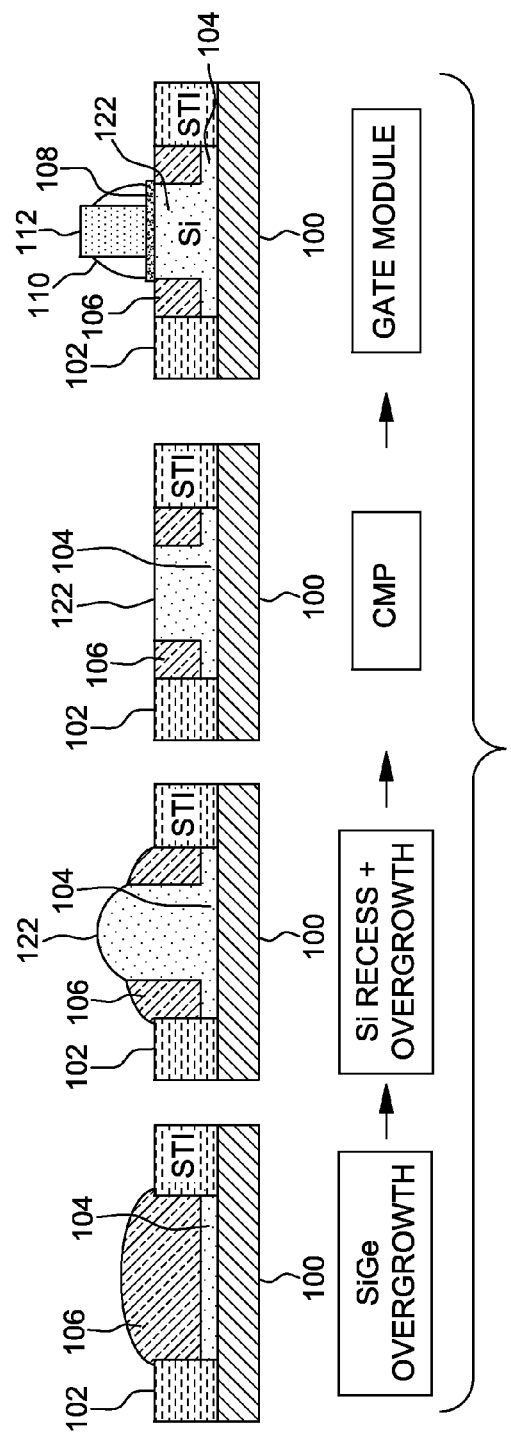

PRE-GATE, SOURCE/DRAIN STRAIN LAYER FORMATION

CROSS-REFERENCE TO RELATED APPLICATIONS

The present invention claims the benefit under 35 U.S.C. §120 as a continuation of U.S. patent application Ser. No. 12/719,312 filed on Mar. 8, 2010, now abandoned.

BACKGROUND

The present invention relates to transistor devices and methods of forming thereof, and more specifically, to methods that form transistors using embedded stressors that can be, but not limited to, silicon germanium for PFET or silicon carbon for NFET. Embedded SiGe (eSiGe) or SiC source/drain regions have been found to dramatically improve channel mobility and are commonly used as a performance enhancement within transistor devices. The integration scheme described below offers several key enhancements, allowing for improved device performance and control.

SUMMARY

According to one embodiment of the present invention, a method is proposed that produces a transistor. The method forms a strain-producing layer on a base layer and then removes at least one portion of the strain-producing layer to create at least one opening in the strain-producing layer. This leaves first and second portions of the strain-producing layer on the substrate. The first and second portions of the strain-producing layer comprise source and drain stressor regions of the transistor. The method then grows a channel region in the opening of the strain-producing layer from the base layer, forms a gate insulator on the channel region, and forms a gate conductor on the gate insulator (after forming the source and drain stressor regions, the channel region, and the gate insulator).

In another embodiment, a method produces a transistor by first forming a strain-producing layer on a base layer and then removing at least one portion of the strain-producing layer to create at least one opening in the strain-producing layer and leave first and second portions of the strain-producing layer on the substrate. The first and second portions of the strain-producing layer again comprise source and drain stressor regions of the transistor. In contrast to the previous embodiment, this embodiment grows a non-uniform channel region in the opening of the strain-producing layer from the base layer. Then, the method forms a gate insulator on the channel region and forms a gate conductor on the gate insulator after forming the source and drain stressor regions, the channel region, and the gate insulator.

In a further embodiment of the present invention, a method produces a transistor. The method forms a strain-producing layer on a base layer and then removes at least one portion of the strain-producing layer to create at least one opening in the strain-producing layer. This leaves first and second portions of the strain-producing layer on the substrate. The first and second portions of the strain-producing layer comprise source and drain stressor regions of the transistor. The method then grows a channel region in the opening of the strain-producing layer from the base layer, grows an additional channel region comprising carbon and germanium on the channel region, forms a gate insulator on the additional channel region, and forms a gate conductor on the gate insulator (after forming the source and drain stressor regions, the channel region, and the gate insulator).

A transistor structure embodiment herein comprises epitaxially grown source and drain stressor regions on the base layer, an epitaxially grown channel region on the base layer between the source and drain stressor regions, a gate insulator on the channel region, and a gate conductor on the gate insulator. The source and drain stressor regions are positioned partially below the gate conductor, and the source and drain stressor regions having vertical sidewalls below the gate conductor.

BRIEF DESCRIPTION OF THE SEVERAL VIEWS OF THE DRAWINGS

FIG. 1 is a schematic cross-sectional diagram illustrating multiple stages of an integrated circuit manufacturing process;

FIG. 2 is a schematic cross-sectional diagram illustrating multiple stages of an integrated circuit manufacturing process;

FIG. 3 is a schematic cross-sectional diagram illustrating multiple stages of an integrated circuit manufacturing process;

FIG. 4 is a schematic cross-sectional diagram illustrating multiple stages of an integrated circuit manufacturing process;

FIG. 5 is a schematic cross-sectional diagram illustrating multiple stages of an integrated circuit manufacturing process;

FIG. 6 is a schematic cross-sectional diagram illustrating multiple stages of an integrated circuit manufacturing process;

FIG. 7 is a schematic cross-sectional diagram illustrating multiple stages of an integrated circuit manufacturing process;

FIG. 8 is a schematic cross-sectional diagram illustrating multiple stages of an integrated circuit manufacturing process.

DETAILED DESCRIPTION

Figure 9:
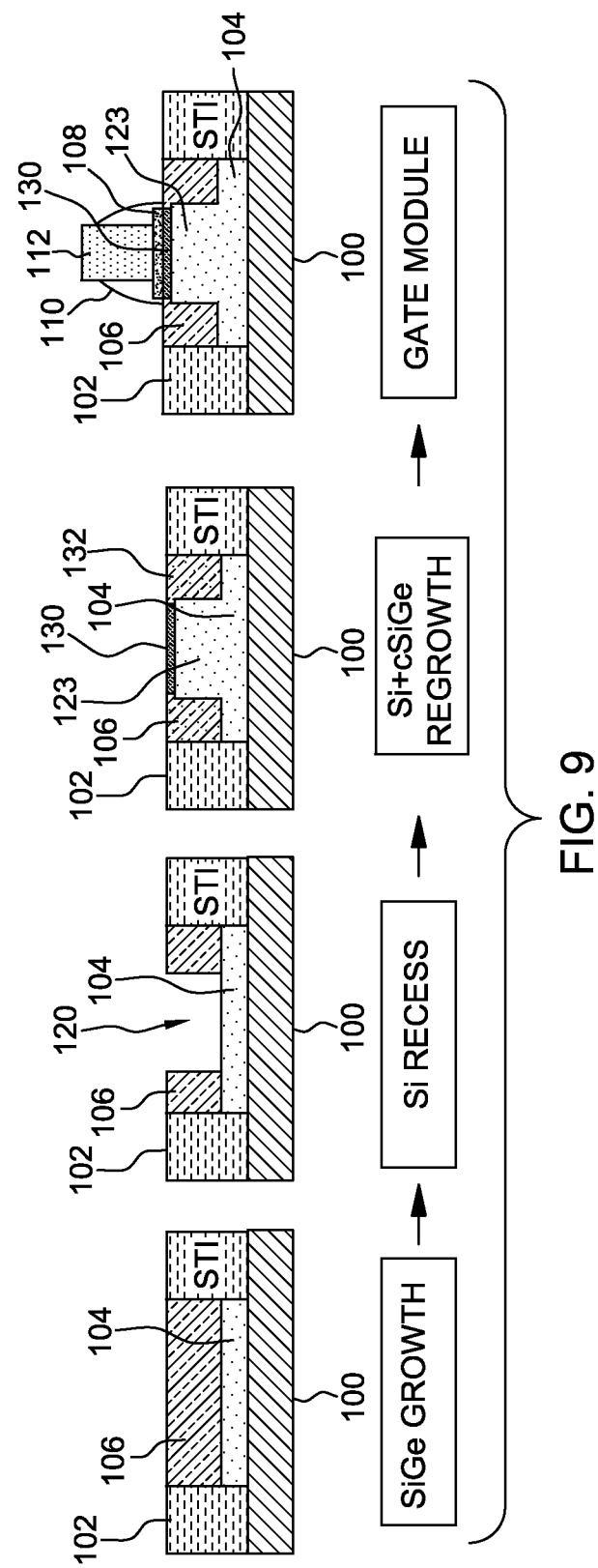
FIG. 9 is a schematic cross-sectional diagram illustrating multiple stages of an integrated circuit manufacturing process.

The embodiments herein provide methods to form transistor structures using epitaxial strain layer growth that is performed before the gate is formed. FIG. 1 is a schematic diagram illustrating multiple stages of an integrated circuit manufacturing process that produces a field effect transistor (FET). As shown in FIG. 1, on the base layer 100, a silicon region 104 is formed between shallow trench isolation (STI) regions 102.

The substrate 100 can comprise any suitable insulating material such as a wafer, ceramic material, insulator, silicon material, etc. If desired, the substrate 100 can include one or more doped well regions. The silicon region 104 comprises a semiconductor that will become the channel region of the transistor and can comprise, for example, Si, SiC, SiGe, SiGeC, Ge alloys, GaAs, InAs, TnP, other III-V or II-VI compound semiconductors, or organic semiconductor structures etc. The silicon region 104 and any well regions can be doped differently depending upon whether the transistor will be a positive-type or a negative-type transistor. The impurities used herein can comprises any negative-type impurity (N-type impurity, e.g., phosphorus (P), arsenic (As), antimony (Sb) etc.) or any positive-type impurity (P-type impurity, e.g., boron, indium, etc.) as well as any other types of impurities, whether currently known or developed in the future. The shallow trench isolation (STI) structures 102 are well-known to those ordinarily skilled in the art and are generally formed by patterning openings and growing or filling the openings with a highly insulating material.

As shown in FIG. 1, the gate oxide insulator 108 is formed on the silicon region 104 and a gate conductor 112 and sidewall spacers 110 are formed on the gate oxide insulator 108. The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein (such as the gate conductor 112) can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

As shown in FIG. 1, the embodiments herein form sidewall spacers 110 on the sidewalls of the gate conductor 112. Sidewall spacers 110 are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers 110.

In FIG. 1, recesses 116 are formed in the silicon region 104 by performing any appropriate selective material removal process such as reactive ion etching (RIE). The shallow trench isolation regions 102 and the sidewall spacers 110 self-align this material removal process to cause the recesses 116 to be positioned on opposite sides of the channel region of the silicon material 104.

Following this, source and drain regions 118 can be deposited into the recesses 116 (or grown within the recesses using an epitaxial growth process). The source and drain regions 118 comprise of embedded epitaxial stressors, most common known being SiGe for PFET and SiC for NFET. Epitaxial growth processes are well-known to those ordinarily skilled in the art and are generally performed by placing the partially formed structure within a chamber that has a high concentration of the material that is to be grown. The combination of temperature and pressure within the chamber allows the material to epitaxially grow upon seed (base) layers of the structure. The seed regions are areas of the structure where the material being grown previously exists. For example, a silicon material can be epitaxially grown on a base layer of silicon; however, during the epitaxial process, different chemicals and materials can be introduced as impurities to change the chemical makeup of the epitaxially grown material. Thus, if desired, during this epitaxial growth process, impurities (such as those mentioned above) may be introduced to change the chemical makeup of the structure being grown. For example, a stressor impurity, such as germanium or carbon, may be introduced into the epitaxial growth process in order to create a material that has a different lattice constant than the base silicon material. By introducing such impurities, the source and drain regions create physical strain or stress within the channel region of the silicon material 104 and thereby improve the transistors performance.

However, the process of epitaxially growing the source and drain regions 118 can encounter difficulties relating to misalignment, incomplete growth, non-uniformity of growth, etc. Therefore, the following embodiments form the transistor body after the epitaxial stressor source and drain layer is grown. More specifically, the embodiments herein first grow the stressor layer (e.g., SiGe or SiC), and then form the main body of the device via recess and epitaxial silicon growth.

According to one embodiment of the present invention, as shown in FIG. 2, one method herein produces a transistor. The method shown in FIG. 2 patterns STI regions within the silicon base layer 104, as discussed above. The method then recesses the silicon base layer 104 and forms (grows) a strain producing layer 106 within the recess. The method shown in FIG. 2 then removes at least one portion of the strain producing layer 106 to create at least one recess 120 in the strain producing layer 106. This leaves first and second portions of the strain producing layer 106 on the substrate 100. The first and second portions of the strain producing layer 106 comprise source and drain stressor regions 106 of the transistor.

The method then grows a channel region 122 in the recess 120 of the strain producing layer 106, forms a gate insulator 108 on the channel region 122, and forms a gate conductor 112 and sidewall spacers 110 on the gate insulator 108 (after forming the source and drain stressor regions 106, the channel region 122, and the gate insulator 108).

When forming the strain producing layer 106, the method epitaxially grows the strain producing layer 106, using processes discussed above. The forming of the strain-producing conductive layer can form a layer of SiGe or SiC. Similarly, when forming the channel region 122, the method epitaxially grows the channel region 122.

As shown in FIGS. 2-4, the methods herein can form the shallow trench isolation regions 102 either before forming the strain-producing layer (FIG. 2), after forming the strain-producing conductive layer and before removing the portion of the strain-producing layer (FIG. 3), or after the forming of the channel region 122 and before the forming of the gate conductor 112 (FIG. 4). The process shown in FIG. 4 eliminates epitaxial facets at the STI edge and allows for a "box shaped" channel region. Note that in all the drawings, the same reference numerals represent the same material, and a redundant discussion of such items is not presented for brevity.

As shown in FIG. 4, because the strain producing layer 106 is grown before the gate stack, which is considered as including elements 108, 110, 112, is formed, its dimensions can be independent of the gate stack 108, 110, 112. Therefore, as shown in FIG. 5, if desired, the source and drain stressor regions 106 can be made to extend beneath the sidewall spacers 110, and even to extend beneath the gate conductor 112. Further the processes described herein form the source and drain stressor regions 106 to have vertical sidewalls beneath the sidewall spacers 110 and gate conductor 112. To the contrary, if source and drain regions are positioned under the spacers 110 using angled processing, such source and drain regions will not have vertical sidewalls, but will have sidewalls that are at some angle to vertical.

With reference to being "beneath" or "above" the structure herein, the gate conductor 112 is considered to be toward the "top" of the structure and the substrate 100 is considered to be toward the "bottom" of the structure. By being "vertical" it is meant that an item runs straight from the bottom of the structure to the top (e.g., at an approximate 0 degree angle). Vertical structures are, therefore, approximately perpendicular (e.g., at an approximate 90 degree angle) to the planar surfaces of the various horizontal layers of the substrate 100, the gate insulator 108, the strain-producing layer 106, etc.

In contrast to the previous embodiments, some embodiments herein (shown in FIGS. 6 and 7) can grow a non-uniform channel region in the recess 120 of the strain producing layer 106. For example, in one embodiment as shown in FIG. 6, the process epitaxially grows a first channel layer 124 (for example SiC) by introducing an impurity during the first part of the epitaxial growth process. Then, the process epitaxially grows a second channel layer 122 on the first channel layer, which can consist solely of pure Si or can comprise some different impurity than was used for the first layer 124.

Another non-uniform channel region 126 is shown in FIG. 7. In this embodiment the process alters the doping concentration during the epitaxial growth of the non-uniform channel region 126. While in the previous non-uniform channel region embodiment, the impurity was added to one portion 124 and not added to the other 122; in the embodiment shown in FIG. 7, the concentration of impurity is gradually increased or decreased during the entire epitaxial growth process. This forms a channel region 126 having a graded doping concentration where there is very little (or no) impurity at the top (or bottom) and a higher level of doping at the bottom (or top) of the layer.

Further, as shown in FIG. 8, in all embodiments herein, the process of forming the strain producing layer 106 can comprise epitaxially growing the strain producing layer 106 above a top level of the shallow trench isolation regions 102; and the process of forming the channel region 122 can comprise epitaxially growing the channel region 122 above the top level of the strain producing layer 106. After this, the method polishes (using, for example chemical-mechanical polishing CMP) the strain producing layer 106 and the channel region 122 until the strain producing layer 106 and the channel region 122 are co-planar with the tops of the shallow trench isolation regions 102 to produce a flat, facet-free channel region.

In an additional method shown in FIG. 9, the methods herein grow the channel region 123 in the recess 120 of the strain producing layer 106, by forming a multilayer channel 123 in the recess. The top (second portion) of the multilayer 123 comprises the transistor channel and is stressed to improve mobility due to lattice mismatch with the first layer underneath. Compression improves PFET mobility, therefore the top layer of the multilayer 123 has a wider lattice constant will be compressed. In the case of NFET the top layer will be grown to have a smaller lattice constant than the layer beneath (second portion) creating a tensile strain and therefore enhancing electron mobility. Additional benefits can be achieved by if the top layer has a different band gap than silicon, therefore modulating the threshold voltage of the transistor via band gap differences between the channel and the high-k or gate dielectric. Additional layers 130, can act as diffusion barriers, retrograde well counter doping and/or Vt adjusting layers, etc.

Therefore, as shown above, the embodiments herein provide pre-gate eSiGe integration schemes which form the eSiGe structure using epitaxial growth that is performed before the gate is formed. These processes eliminate the epitaxial fill height-dependent device variability and allow the silicon channel surface to relax, increasing the channel strain and device performance. This also allows negative-proximity P-type field effect transistor (PFET) to produce higher stress. Further, embodiments herein allow the eSiGe vertical composition gradient to be adjusted independently of the horizontal composition gradient, enhancing channel strain.

The methods described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of producing a transistor, said method comprising:

forming a base layer on a substrate;

forming shallow trench isolation regions extending vertically through said base layer to said substrate;

forming a recess in said base layer between said shallow trench isolation regions such that a lower portion of said base layer remains between said shallow trench isolation regions;

forming a strain-producing layer in said recess on said base layer and extending laterally between and immediately adjacent to said shallow trench isolation regions;

removing at least one portion of said strain-producing layer to create an opening in said strain-producing layer and leave first and second portions of said strain-producing layer on said base layer, said first and second portions of said strain-producing layer comprising source and drain stressor regions of said transistor;

growing a channel region in said opening of said strain-producing layer from said base layer;

forming a gate insulator on and immediately adjacent to co-planar top surfaces of said channel region and said source and drain stressor regions adjacent to said channel region;

forming a gate conductor on said gate insulator after forming said source and drain stressor regions, said channel region, and said gate insulator, said gate conductor being formed so as to be on and immediately adjacent to said gate insulator and further above and vertically overlapping with said source and drain stressor regions such that only said gate insulator is stacked between said source and drain stressor regions and said gate conductor.

2. The method according to claim 1, said substrate comprising an insulator layer and said shallow trench isolation regions extending through said base layer to said insulator layer.

3. The method according to claim 1, said forming said strain-producing layer comprising epitaxially growing said strain-producing layer, and said growing of said channel region comprising epitaxially growing said channel region.

4. The method according to claim 1, said forming said strain-producing layer comprising forming a layer of one of SiGe and SiC.

5. The method according to claim 1, said growing said channel region in said opening of said strain-producing layer comprising forming sidewalls of said strain-producing layer and of said channel region where said strain-producing layer and said channel region meet, said sidewalls being perpendicular to planar surfaces of said top of said transistor.

6. The method according to claim 5, said channel region being narrower than each of said source and drain stressor regions.

7. A method of producing a transistor, said method comprising:

providing a silicon-on-insulator wafer comprising a semiconductor substrate, an insulator layer on said semiconductor substrate and a base layer on said insulator layer;

forming shallow trench isolation regions that extend vertically through said base layer to said insulator layer;

forming a recess in said base layer between said shallow trench isolation regions such that a lower portion of said base layer remains between said shallow trench isolation regions, said recess having a depth that is greater than one-half a thickness of said base layer;

forming a strain-producing layer in said recess on said base layer and extending laterally between and immediately adjacent to said shallow trench isolation regions such that said strain-producing layer is thicker than said lower portion;

removing at least one portion of said strain-producing layer to create an opening in said strain-producing layer and leave first and second portions of said strain-producing layer on said base layer, said first and second portions of said strain-producing layer comprising source and drain stressor regions of said transistor;

growing a channel region from said base layer in said opening of said strain-producing layer to a top of said strain-producing layer;

forming a gate insulator on and immediately adjacent to co-planar top surfaces of said channel region and said source and drain stressor regions adjacent to said channel region; and forming a gate conductor on said gate insulator after forming said source and drain stressor regions, said channel region, and said gate insulator, said gate conductor being formed so as to be on and immediately adjacent to said gate insulator and further above and vertically overlapping with said source and drain stressor regions such that only said gate insulator is stacked between said source and drain stressor regions and said gate conductor.

8. The method according to claim 7, said channel region being narrow than each of said source and drain regions.

9. The method according to claim 7, said forming said strain-producing layer comprising epitaxially growing said strain-producing layer, and said growing of said channel region comprising epitaxially growing said channel region.

10. The method according to claim 7, said forming said strain-producing layer comprising forming a layer of one of SiGe and SiC.

11. The method according to claim 7, said growing said channel region in said opening of said strain-producing layer comprising forming sidewalls of said strain-producing layer and of said channel region where said strain-producing layer and said channel region meet, said sidewalls being perpendicular to planar surfaces of said top of said strain-producing layer, said planar surfaces being parallel to said gate insulator.

* * * * *